(12) United States Patent  (10) Patent No.: US 12,138,736 B2
Yun et al.                  (45) Date of Patent:    Nov. 12, 2024

(54) POLISHING PAD SHEET, POLISHING PAD, AND METHOD FOR MANUFACTURING SEMICONDUCTOR DEVICE

(71) Applicant: SK enpulse Co., Ltd., Gyeonggi-do (KR)

(72) Inventors: Sung Hoon Yun, Seoul (KR); Kyung Hwan Kim, Seoul (KR); Jae In Ahn, Gyeonggi-do (KR); Jang Won Seo, Seoul (KR)

(73) Assignee: SK ENPULSE CO., LTD., Gyeonggi-do (KR)

(*) Notice: Subject to any disclaimer, the term of this patent is extended or adjusted under 35 U.S.C. 154(b) by 448 days.

(21) Appl. No.: 17/544,639

(22) Filed: Dec. 7, 2021

(65) Prior Publication Data
US 2022/0176514 A1    Jun. 9, 2022

(30) Foreign Application Priority Data
Dec. 7, 2020    (KR) .................... 10-2020-0169130

(51) Int. Cl.
B24B 37/22    (2012.01)
B24B 37/24    (2012.01)
B24D 3/28     (2006.01)
C09G 1/16     (2006.01)
H01L 21/306   (2006.01)

(52) U.S. Cl.
CPC .............. B24B 37/22 (2013.01); B24B 37/24 (2013.01); B24D 3/28 (2013.01); H01L 21/30625 (2013.01); C09G 1/16 (2013.01)

(58) Field of Classification Search
CPC ......... B24B 37/00; B24B 37/22; B24B 37/24; B24B 37/26; B24D 3/28; C09G 1/16
See application file for complete search history.

(56) References Cited

FOREIGN PATENT DOCUMENTS

KR    10-2008-0005558 A    1/2008
KR    10-2011-0010727 A    2/2011

OTHER PUBLICATIONS

Office Action for application 10-2020-0169130 issued by the Korean Intellectual Property Office on Jun. 28, 2022.

*Primary Examiner* — Pegah Parvini
(74) *Attorney, Agent, or Firm* — IP & T GROUP LLP

(57) ABSTRACT

A polishing pad sheet which provides optimized interfacial properties for the laminated structure of a polishing pad based on appropriate elasticity and high durability, and in which the polishing pad having the polishing pad sheet applied thereto not only has its intrinsic function such as the polishing rate or the like, but also is capable of realizing the function without damage even during the polishing process in a wet environment for a long time, and a polishing pad to which the polishing pad sheet is applied. The polishing pad sheet includes: a first surface which is a polishing layer attachment surface; and a second surface which is a rear surface of the first surface, wherein the first surface has a value of the following Equation 1 of 4.20 to 5.50:4.20≤ (|Sv|)/Sz×P (%)≤5.50.

20 Claims, 4 Drawing Sheets

[FIG. 1]
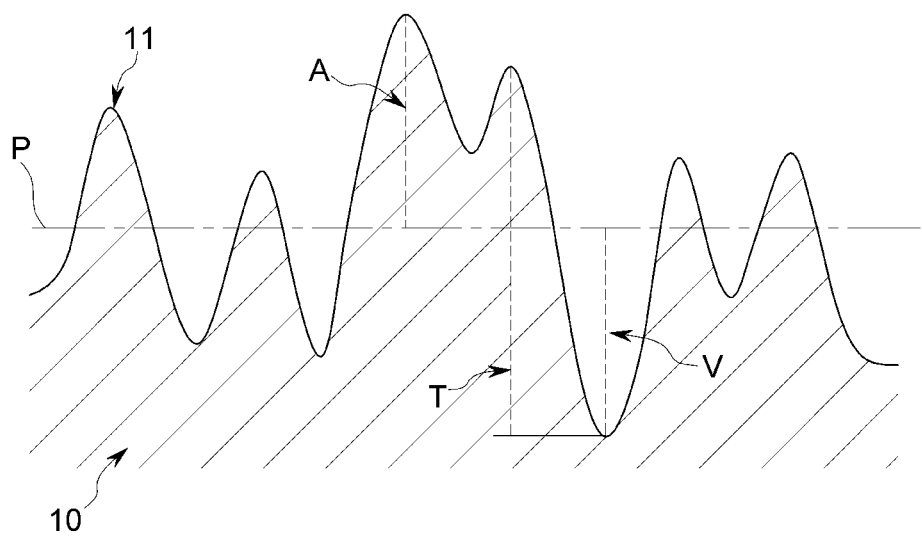

[FIG. 2]
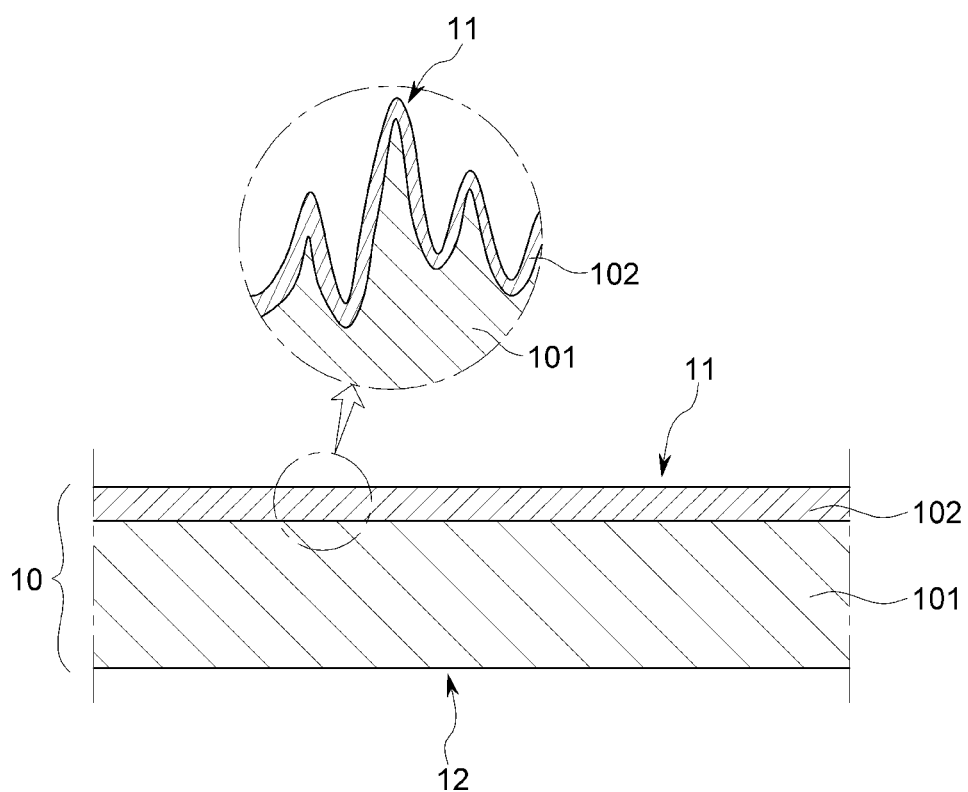

[FIG. 3]
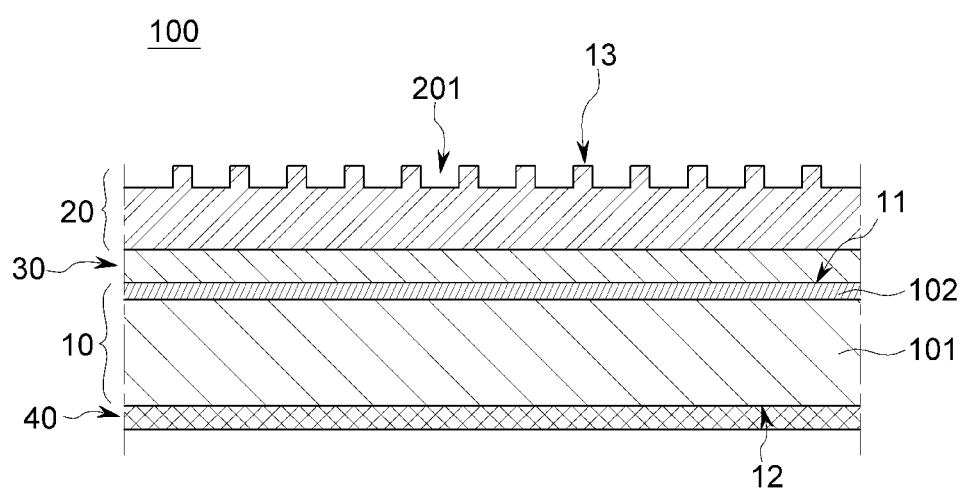

[FIG. 4]
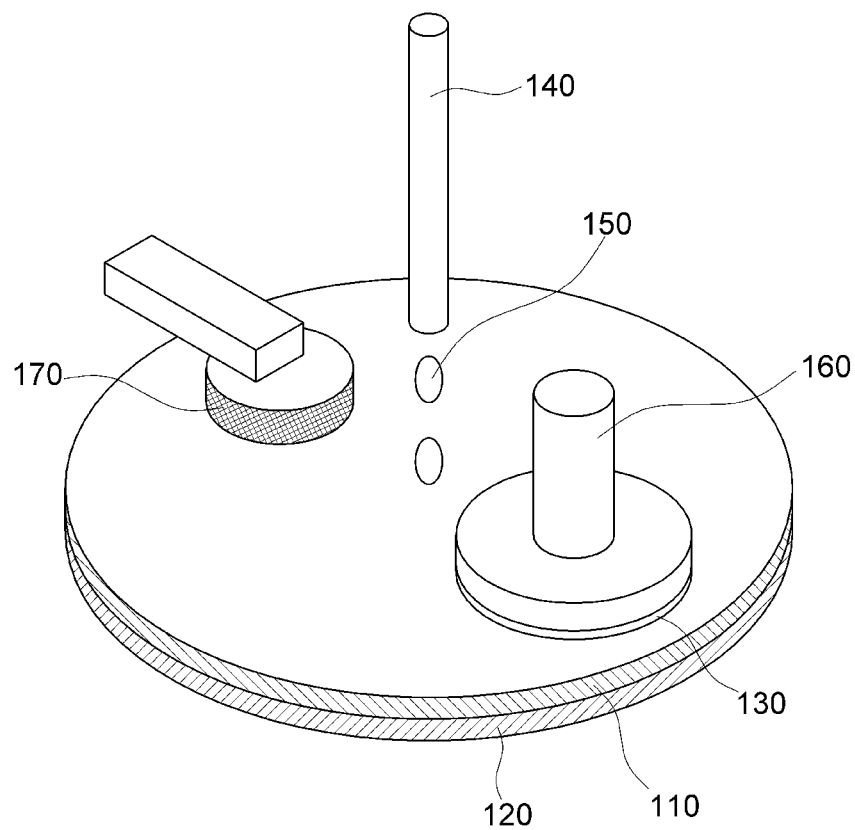

POLISHING PAD SHEET, POLISHING PAD, AND METHOD FOR MANUFACTURING SEMICONDUCTOR DEVICE

CROSS-REFERENCE TO RELATED APPLICATION(S)

This application claims priority to Korean Patent Application No. 10-2020-0169130, filed on Dec. 7, 2020, the disclosure of which is incorporated herein by reference in its entirety.

TECHNICAL FIELD

The present disclosure relates to a polishing pad sheet, which is a component of a pad applied to a polishing process, and relates to a polishing pad using such a polishing pad sheet. Further, the present disclosure relates to a method for manufacturing a semiconductor device to which such a polishing pad is applied.

DESCRIPTION OF THE RELATED ART

A chemical mechanical planarization (CMP) or chemical mechanical polishing (CMP) process may be performed for various purposes in various technical fields. The CMP process is performed on a predetermined polishing surface of a polishing object, and may be performed for the purposes of planarization of the polishing surface, removal of aggregated materials, reduction of crystal lattice damage, removal of scratches and contamination sources, etc.

CMP process technologies for semiconductor processes may be classified depending on the quality of a polishing object film or the surface shape after polishing. For example, they may be classified into a CMP process for single silicon and a CMP process for polysilicon depending on the quality of a polishing object film, and may be classified into CMP processes for various oxide films, which are distinguished by the types of impurities, or CMP processes for metal films of tungsten (W), copper (Cu), aluminum (Al), ruthenium (Ru), tantalum (Ta), etc. In addition, depending on the surface shape after polishing, they may be classified into a process of relieving the roughness of the substrate surface, a process of planarizing a stepped portion caused by multilayer circuit wiring, and a device isolation process for selectively forming circuit wiring after polishing.

A plurality of CMP processes may be applied in a process of manufacturing a semiconductor device. A semiconductor device includes a plurality of layers, and each layer includes a complex and fine circuit pattern. Further, semiconductor devices have recently been evolving in a direction in which the size of an individual chip is reduced, and the pattern of each layer becomes more complex and finer. Accordingly, the CMP process in the process of manufacturing a semiconductor device has been expanded not only for the purpose of planarizing circuit wiring, but also for the purpose of applying the isolation of circuit wiring and the improvement of the wiring surface, and as a result, more sophisticated and reliable CMP performance is being required.

A polishing pad which is used in such a CMP process is a component for a process of processing a polishing surface to a required level through friction, and may be seen as one of factors which are most important in the thickness uniformity of a polishing object after polishing, the flatness and polishing quality of the polishing surface, etc.

SUMMARY

In an embodiment, it is intended to provide a polishing pad sheet, which is applied to a polishing pad to be able to implement appropriate elasticity and high durability, and enables a stable polishing process through this.

In another embodiment, it is intended to provide a polishing pad, as a polishing pad to which the polishing pad sheet is applied, in which the interfacial properties between a polishing layer and a cushion layer are expressed as optimized physical properties in realizing the overall polishing performance of the polishing pad, and which can implement functions without damage and can also excellently implement original functions such as polishing rate, etc. even during the polishing process in a wet environment for a long time.

In another embodiment, it is intended to provide a method for manufacturing a semiconductor device, which exhibits high process efficiency in polishing of a semiconductor substrate by applying the polishing pad, and enables the surface to be polished of the semiconductor substrate in the final polishing result to exhibit an appropriate polishing rate, the lowest level of defects, and excellent polishing flatness.

In an embodiment, there is provided a polishing pad sheet including: a first surface which is a polishing layer attachment surface; and a second surface which is a rear surface of the first surface, wherein the first surface has a value of Equation 1 below of 4.20 to 5.50.

$$\frac{|Sv|}{Sz} \times P(\%) \quad \text{[Equation 1]}$$

where, Sv is a maximum pit height roughness value of the first surface, Sz is a maximum height roughness value of the first surface, and P is a compressibility (%) value calculated from the equation of $(D1-D2)/D1 \times 100$ by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

The first surface may further satisfy the condition that Equation 2 below has a value of 0.10 to 0.35.

$$\frac{|Sv|}{Sz} \quad \text{[Equation 2]}$$

The first surface may further satisfy the condition that Equation 3 below has a value of 1.50 to 2.50.

$$\frac{Sa}{Sz} \times P(\%) \quad \text{[Equation 3]}$$

In Equation 3 above, Sa is an arithmetical mean height roughness value of the first surface, Sz is a maximum height roughness value of the first surface, and P is a compressibility (%) value calculated from the equation of $(D1-D2)/D1 \times 100$ by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

The first surface may further satisfy the condition that Equation 4 below has a value of 0.10 to 0.20.

$$\frac{Sa}{Sz}$$ [Equation 4]

In another embodiment, there is provided a polishing pad including a polishing layer and a cushion layer, wherein the cushion layer is derived from a polishing pad sheet, the polishing pad sheet includes: a first surface which is a polishing layer attachment surface; and a second surface which is a rear surface of the first surface, the first surface has a value of Equation 1 below of 4.20 to 5.50, and the adhesive force of the polishing layer attachment surface to the polishing layer is 8.00 kgf/25 mm or more.

$$\frac{|Sv|}{Sz} \times P(\%)$$ [Equation 1]

where, Sv is a maximum pit height roughness value of the first surface, Sz is a maximum height roughness value of the first surface, and P is a compressibility (%) value calculated from the equation of (D1−D2)/D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

In another embodiment, there is provided a method for manufacturing a semiconductor device, the method comprising the steps of: providing a polishing pad including a polishing layer and a cushion layer; and disposing the surface to be polished of a polishing object to be in contact with the polishing surface of the polishing layer and then polishing the polishing object while rotating them relative to each other under a pressurized condition, wherein the polishing object includes a semiconductor substrate, the cushion layer is derived from a polishing pad sheet, the polishing pad sheet includes: a first surface which is a polishing layer attachment surface; and a second surface which is a rear surface of the first surface, the first surface has a value of Equation 1 below of 4.20 to 5.50, and the adhesive force of the polishing layer attachment surface to the polishing layer is 8.00 kgf/25 mm or more.

$$\frac{|Sv|}{Sz} \times P(\%)$$ [Equation 1]

where, Sv is a maximum pit height roughness value of the first surface, Sz is a maximum height roughness value of the first surface, and P is a compressibility (%) value calculated from the equation of (D1−D2)/D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

The polishing pad sheet may be applied to the polishing pad to enable appropriate elasticity and high durability to be implemented, thereby enabling a stable polishing process.

The polishing pad is a polishing pad to which the polishing pad sheet is applied, in which the interfacial properties between a polishing layer and a cushion layer are expressed as optimized physical properties in realizing the overall polishing performance of the polishing pad, and which can implement functions without damage and can also excellently implement original functions such as polishing rate, etc. even during the polishing process in a wet environment for a long time.

The method for manufacturing the semiconductor device exhibits high process efficiency in polishing of a semiconductor substrate by applying the polishing pad, and enables the surface to be polished of the semiconductor substrate in the final polishing result to exhibit an appropriate polishing rate, the lowest level of defects, and excellent polishing flatness.

BRIEF DESCRIPTION OF THE DRAWINGS

FIG. 1 schematically illustrates an enlarged view of a portion of a first surface in a cross-section of a polishing pad sheet according to an embodiment.

FIG. 2 schematically illustrates a cross-sectional view of a polishing pad sheet according to an embodiment.

FIG. 3 schematically illustrates a cross-sectional view of a polishing pad according to an embodiment.

FIG. 4 is a schematic diagram schematically illustrating a method for manufacturing a semiconductor device according to an embodiment.

DESCRIPTION OF SPECIFIC EMBODIMENTS

The advantages and features of the present disclosure, and the way of attaining them, will become apparent with reference to the embodiments to be described later. However, the present disclosure is not limited to the embodiments disclosed below, but will be implemented in a variety of different forms, only these embodiments allow the disclosure of the present disclosure to be complete and are provided to fully inform those who have common knowledge in the art to which the present disclosure pertains of the scope of the invention, and the present disclosure is only defined by the scope of the claims.

In order to clearly express various layers and regions in the drawings, the thicknesses are enlarged to be shown. In addition, in the drawings, the thicknesses of some layers and regions are exaggerated for convenience of explanation. Throughout the specification, like reference numerals refer to like elements.

In addition, in the present specification, when a part of a layer, film, region, plate, or the like is said to be "on" or "above" other part, it not only includes a case where the part is "directly on" the other part, but also includes a case where there is another part in the middle thereof. Conversely, when any part is said to be "directly above" other part, it means that there is not another part in the middle thereof. In addition, when it is said that a part of a layer, film, region, plate, etc. is "below" or "under" other part, it not only includes a case where the part is "directly below" the other part, but also includes a case where there is another part in the middle thereof. Conversely, when a part is said to be "directly below" other part, it means that there is not another part in the middle thereof.

In an embodiment, there is provided a polishing pad sheet including: a first surface which is a polishing layer attachment surface; and a second surface which is a rear surface of the first surface, wherein the first surface has a value of Equation 1 below of 4.20 to 5.50.

$$\frac{|Sv|}{Sz} \times P(\%)$$ [Equation 1]

where, Sv is a maximum pit height roughness value of the first surface, Sz is a maximum height roughness value of the first surface, and P is a compressibility (%) value calculated from the equation of (D1−D2)/D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

FIG. 1 schematically illustrates an enlarged view of a portion of the first surface in a cross-section of the polishing pad sheet. Referring to FIG. 1, the polishing pad sheet 10 includes a first surface 11, and the surface of the first surface has a surface structure in which peaks and valleys of irregular heights are continued. When a plane in which the sum of the peaks (+) and the valleys (−) becomes 0 (zero) is defined as the reference plane P, the linear distance value V from the reference plane to the vertex of the valley having the maximum depth is defined as the Sv value. Further, the linear distance value T from the vertex of the valley having the maximum depth to the vertex of the peak having the maximum height is defined as the Sz value. The Sv and Sz are three-dimensional surface roughness measurement values, and those shown in FIG. 1 are only expressed in two dimensions for convenience of explanation.

P is a compressibility (%) value calculated from the equation of (D1−D2)/D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed. The polishing pad sheet is a sheet having elasticity, and when compressed under a predetermined pressurization condition, the final thickness of the sheet is reduced compared to the initial thickness.

In an embodiment, the polishing pad sheet may be applied as one layer of a polishing pad used in a polishing process during semiconductor manufacturing. As semiconductor structures become finer and more complex in recent years, sophisticated control is required for a polishing process in a semiconductor manufacturing process. Accordingly, the polishing result may be entirely differently changed even by minute changes in the physical and/or mechanical properties of the polishing pad applied thereto. When the correlation between the ratio of Sv to Sz in the three-dimensional surface roughness of the first surface and the compressibility of the polishing pad sheet satisfies Equation 1 above, the present inventor of the present disclosure has found that a polishing pad to which the polishing pad sheet is applied achieves excellent polishing performance when applied to the polishing process of the semiconductor process.

Referring to FIG. 1, the linear distance value A from the reference plane P to the vertex of the peak having the maximum height is defined as the maximum peak height (Sp) value. Substantially, Sz is the sum of an absolute value of Sv and an absolute value of Sp. At this time, in Equation 1 above, the ratio of the absolute value of Sv to that of Sz is a ratio of the linear distance value V from the reference plane P to the maximum low point to the entire linear distance T from a maximum low point to a maximum high point, which has a greater technical significance in terms of considering the application of the polishing pad sheet compared to the ratio of Sp to Sz.

Specifically, the polishing pad sheet may be applied as a polishing pad having a structure in which a polishing layer is laminated on the first surface side. That is, the first surface may function as a polishing layer attachment surface. In the case that the ratio of the absolute value of Sv to that of Sz of the first surface satisfies an appropriate ratio, when the polishing pad sheet is attached and applied to the polishing layer with the first surface being used as an interface, it is possible to secure excellent interfacial adhesive force, and it is possible to implement a suitable buffer action against the external pressure applied through the polishing layer during the semiconductor polishing process. Furthermore, when the polishing pad sheet allows the value of Equation 1 above to satisfy the above-mentioned range in the correlation between the compressibility and the ratio of the absolute value of Sv to that of Sz, this technical advantage may be maximized.

More specifically, the first surface of the polishing pad sheet may have a value of Equation 1 above of about 4.20 to about 5.50, for example, about 4.20 to about 5.50, for example, about 4.20 to about 4.60, for example, about 4.20 to about 4.45.

In an embodiment, the first surface of the polishing pad sheet may further satisfy the condition that the value of Equation 2 below is 0.10 to 0.35.

$$\frac{|Sv|}{Sz}$$ [Equation 2]

As described above, considering the technical significance of the ratio of the absolute value of Sv to that of Sz, it may be more advantageous specifically when this value satisfies the above range.

More specifically, the polishing pad sheet may have a value of Equation 2 above of about 0.10 to about 0.35, for example, about 0.15 to about 0.35, for example, about 0.15 to about 0.30, for example, about 0.20 to about 0.35.

In an embodiment, the first surface of the polishing pad sheet may further satisfy the condition that the value of Equation 3 below is 1.50 to 2.50.

$$\frac{Sa}{Sz} \times P(\%)$$ [Equation 3]

In Equation 3 above, Sa is an arithmetical mean height roughness value of the first surface, Sz is a maximum height roughness value of the first surface, and P is a compressibility (%) value calculated from the equation of (D1−D2)/

D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

Referring to FIG. 1, Sa means an arithmetic mean value of linear distances from the reference plane P to the vertex of each peak with respect to a plurality of peaks on the first surface. When the correlation between the ratio of the value of Sa to that of Sz and the compressibility of the polishing pad sheet satisfies the above range, the polishing pad sheet has the advantage of enabling the desired technical performance to be secured over the entire area. If the first surface of the polishing pad sheet exhibits corresponding physical/mechanical properties by having a locally excessively different structure, it may cause defects such as scratches or the like on the semiconductor substrate during a polishing process using the polishing pad to which the polishing pad sheet is applied. The polishing pad sheet according to an embodiment has an advantage of allowing the technical effect achieved by Equation 1 above to be uniformly implemented over the entire area by further satisfying the condition of Equation 3 above in addition to the condition of Equation 1 above.

More specifically, the polishing pad sheet may have a value of Equation 3 above of about 1.50 to about 2.50, for example, about 1.50 to about 2.45, for example, about 1.60 to about 2.45, for example, about 1.80 to about 2.45, for example, about 1.85 to about 2.45.

In an embodiment, the polishing pad sheet may further satisfy the condition that the value of Equation 4 below is 0.10 to 0.20.

$$\frac{Sa}{Sz} \qquad \text{[Equation 4]}$$

As described above, considering the technical significance of the ratio of Sa to Sz, it may be more advantageous specifically when this value satisfies the above range.

More specifically, the polishing pad sheet may have a value of Equation 4 above of about 0.10 to about 0.20, for example, about 0.11 to about 0.18.

In an embodiment, the polishing pad sheet may comprise: a first layer containing a fibrous nonwoven fabric and a resin impregnated in the fibrous nonwoven fabric; and a second layer which is a coating layer on at least one surface of the first layer.

FIG. 2 schematically illustrates a cross-section of the polishing pad sheet 10 according to an embodiment. Referring to FIG. 2, the polishing pad sheet includes the first layer 101 and the second layer 102, and a surface of the second layer 102 opposite to the first layer 101 side may be the first surface 11. Further, a surface of the first layer 101 opposite to the second layer 102 side may be the second surface 12.

The fibrous nonwoven fabric may include, for example, one selected from the group consisting of polyester fibers, polyamide fibers, polypropylene fibers, polyethylene fibers, and combinations thereof.

The resin may include, for example, one selected from the group consisting of a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof.

The coating layer may contain, for example, a polyurethane resin. The polyurethane resin may include, for example, a reaction product of: a diisocyanate component including one selected from the group consisting of 2,4-toluenediisocyanate (2,4-TDI), 2,6-toluenediisocyanate (2,6-TDI), 4,4'-dicyclohexylmethane diisocyanate ($H_{12}$MDI), methylene diphenyl diisocyanate (MDI), and combinations thereof and a diol component including one selected from the group consisting of polytetramethylene ether glycol (PTMG), polypropylene ether glycol (PEG), ethylene glycol (EG), butanediol (BG), and combinations thereof.

In an embodiment, the thickness ratio of the second layer to the first layer may be about 1:0.08 to about 1:0.25, for example, about 1:0.08 to about 1:0.20. The thickness ratio is expressed as a ratio of the average thickness of each of the first layer and the second layer, and when the first surface functions as a polishing layer attachment surface in the case that the thickness ratio satisfies such a range, excellent adhesion may be realized, and it is possible to secure the advantage that the lifespan of the polishing pad to which the polishing pad sheet is applied becomes longer. Further, it may be advantageous to adjust the polishing pad sheet to satisfy the value of Equation 1 above within the above-described range, and excellent mechanical properties corresponding to the value of Equation 1 above may be secured through this.

The polishing pad sheet may have a surface hardness measured on the first surface of about 60 to about 90, for example, about 60 to about 80, for example, about 60 to about 75 based on Asker C hardness. When the polishing pad sheet satisfies the value of Equation 1 above in a predetermined range and has a surface hardness in such a range at the same time, it may be advantageous in realizing particularly a defect prevention effect among the resulting polishing performances of the polishing pad to which the polishing pad sheet is applied.

The polishing pad sheet may have a density of about 0.300 $g/cm^3$ to about 0.800 $g/cm^3$, for example, about 0.400 $g/cm^3$ to about 0.700 $g/cm^3$, for example, about 0.400 $g/cm^3$ to about 0.650 $g/cm^3$. When the polishing pad sheet satisfies the value of Equation 1 above in a predetermined range and has a density in such a range at the same time, the polishing pad to which the polishing pad sheet is applied may provide an appropriate elastic force to a semiconductor substrate during the polishing process, and the overall polishing flatness of the semiconductor substrate may be improved and defect prevention performance may be maximized by the buffering action based on such an elastic force.

Hereinafter, a method for manufacturing the polishing pad sheet will be described in detail.

The polishing pad sheet may be manufactured through a manufacturing method comprising the steps of: manufacturing a fibrous nonwoven fabric; manufacturing a sheet by impregnating the fibrous nonwoven fabric with a resin and drying or curing the fibrous nonwoven fabric impregnated with the resin; and processing the sheet so that the sheet satisfies the value of Equation 1 above in a range of 4.20 to 5.50.

The fibrous nonwoven fabric refers to a nonwoven fiber structure. A wet manufacturing process or a dry manufacturing process may be applied to the step of manufacturing the fibrous nonwoven fabric. For example, one method selected from the group consisting of a spun-bonded method, a spunlace method, a melt-blown method, a thermally-bonded method, a carding method, an air-lay method, a needle punching method, a stitch bonded method, and combinations thereof may be applied to the step of manufacturing the fibrous nonwoven fabric, but the present disclosure is not limited thereto.

The fibrous nonwoven fabric may include, for example, one selected from the group consisting of polyester fibers, polyamide fibers, polypropylene fibers, polyethylene fibers, and combinations thereof.

For example, one method selected from the group consisting of an impregnation method, a spray method, a foam method, a print method, and combinations thereof may be applied to a method of impregnating the fibrous nonwoven fabric with the resin, but the present disclosure is not limited thereto.

The resin for impregnating the fibrous nonwoven fabric may include, for example, one selected from the group consisting of a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof.

The step of processing the sheet so that the sheet satisfies the value of Equation 1 above in a predetermined range may be performed by a method of coating a resin on at least one surface of the sheet.

A dry method or a wet method may be applied to the coating method, for example, one method selected from the group consisting of a blade coating method, a knife coating method, an air doctor coating method, a roll coating method, a gravure coating method, and combinations thereof may be applied to the coating method, but the present disclosure is not limited thereto.

The resin for coating may include, for example, one selected from the group consisting of a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof.

The resin for coating may include, for example, a polyurethane resin. The polyurethane resin may include, for example, a reaction product of: a diisocyanate component including one selected from the group consisting of 2,4-toluenediisocyanate (2,4-TDI), 2,6-toluenediisocyanate (2,6-TDI), 4,4'-dicyclohexylmethane diisocyanate ($H_{12}$MDI), methylene diphenyl diisocyanate (MDI), and combinations thereof and a diol component including one selected from the group consisting of polytetramethylene ether glycol (PTMG), polypropylene ether glycol (PEG), ethylene glycol (EG), butanediol (BG), and combinations thereof.

In another embodiment, there is provided a polishing pad including a polishing layer and a cushion layer, wherein the cushion layer is derived from a polishing pad sheet, the polishing pad sheet includes: a first surface which is a polishing layer attachment surface; and a second surface which is a rear surface of the first surface, the first surface has a value of Equation 1 below of 4.20 to 5.50, and the adhesion of the first surface to the polishing layer is 8.00 kgf/25 mm or more.

$$\frac{|Sv|}{Sz} \times P(\%) \qquad \text{[Equation 1]}$$

where, Sv is a maximum pit height roughness value of the first surface, Sz is a maximum height roughness value of the first surface, and P is a compressibility (%) value calculated from the equation of (D1−D2)/D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

All matters regarding the polishing pad sheet are the same as described above. That is, the specific details and technical advantages thereof described above with respect to the polishing pad sheet are all integrally applied with respect to the polishing pad. The polishing pad sheet in which the value of Equation 1 above on the first surface satisfies the above-mentioned range is applied as the cushion layer so that the interfacial adhesion between the polishing layer and the cushion layer may be greatly improved, and the buffering action and support action of the cushion layer against the external pressure transmitted through the polishing layer may be excellently implemented at the same time.

The first surface may have an adhesive force to the polishing layer of about 8.00 kgf/25 mm or more, for example, about 8.00 kgf/25 mm to about 20.00 kgf/25 mm, for example, about 9.00 kgf/25 mm to about 15.00 kgf/25 mm, for example, about 10.00 kgf/25 mm to about 15.00 kgf/25 mm, for example, about 11.00 kgf/25 mm to about 15.00 kgf/25 mm. The interfacial adhesive force between the cushion layer and the polishing layer satisfies such a range so that the long-term durability of the polishing pad is improved, and excellent mechanical rigidity may be achieved without generating bubbles or tear during the polishing process in a wet environment lasting for several tens of hours.

FIG. 3 schematically illustrates a cross-sectional view of the polishing pad 100 according to an embodiment. Referring to FIG. 3, the polishing pad 100 is characterized in that it includes a polishing layer 20 and a cushion layer, wherein the cushion layer is derived from the polishing pad sheet 10. As the cushion layer is derived from the polishing pad sheet 10, it may include the first layer 101 and the second layer 102. Matters regarding the first layer 101 and the second layer 102 are the same as described above with respect to the polishing pad sheet.

In an embodiment, the polishing pad 100 may further include a first adhesive layer 30 that becomes a medium for the attachment of the polishing layer 20 and the cushion layer.

The first adhesive layer 30 may contain, for example, a heat-sealing adhesive. Specifically, the first adhesive layer 30 may contain one selected from the group consisting of a urethane-based adhesive, a silicone-based adhesive, a rubber-based adhesive, an acrylic adhesive, and combinations thereof.

In an embodiment, the first adhesive layer 30 may contain a urethane-based adhesive, and the coating layer 102 may contain a polyurethane-based resin. In this case, the adhesive force between the polishing layer and the cushion layer may be greatly improved through the first adhesive layer as a medium, and the long-term durability that implements excellent mechanical rigidity without generating bubbles or tear during the polishing process in a wet environment lasting for several tens of hours may be maximized.

Referring to FIG. 1, the polishing layer 20, as a sheet form having a predetermined thickness, has a polishing surface 13 that is in direct or indirect contact with a surface to be polished of a polishing object. The polishing surface 13 is in physical contact with the surface to be polished of the polishing object and serves to perform a practical mechanical polishing function.

In an embodiment, the polishing layer may have a thickness of about 0.8 mm to about 5.0 mm, for example, about 1.0 mm to about 4.0 mm, for example, about 1.0 mm to 3.0 mm, for example, about 1.5 mm to about 3.0 mm, for example, about 1.7 mm to about 2.7 mm, for example, about 2.0 mm to about 3.5 mm.

In an embodiment, the polishing surface 13 may include a groove 201 machined to a depth smaller than the thickness of the polishing layer 20. The polishing surface 13 may include a plurality of grooves 201. In an embodiment, the polishing pad 100 may have a structure that its plane is substantially circular, and the plurality of grooves 201 may have, for example, a concentric circular structure that they are disposed to be spaced apart at predetermined intervals from a center on a plane of the polishing layer 20 toward an end thereon. In another embodiment, the plurality of grooves 201 may have a radial structure that they are continuously formed from the center on the plane of the polishing layer 20 toward the end thereon. In another embodiment, the plurality of grooves 201 may have the concentric circular structure and the radial structure at the same time. The grooves 201 may play a role of adjusting the physical polishing properties by adjusting the fluidity of a polishing liquid or polishing slurry supplied to the polishing surface 13 during the polishing process using the polishing pad 100, or adjusting the size of a contact area between the polishing surface 13 and the surface to be polished of the polishing object.

The polishing layer may include a plurality of pores. The plurality of pores may have an average size of about 5 μm to about 50 μm, for example, about 5 μm to about 40 μm, for example, about 10 μm to about 40 μm, for example, about 10 μm to about 35 μm, but the present disclosure is not limited thereto. The plurality of pores may be partially exposed to the outside from the polishing surface of the polishing layer to appear as fine concave portions distinguished from the grooves 201, these may function as an adjusting element of polishing properties by determining the fluidity and mooring space of the polishing liquid or polishing slurry together with the grooves 201 during use of the polishing pad.

In an embodiment, the polishing pad 100 includes the second surface 12 that is the rear surface of the first surface 11 of the cushion layer, and may further include a second adhesive layer 40 disposed on the second surface. The second adhesive layer 40, as a configuration for attaching the polishing pad 100 to the surface plate of a polishing apparatus, may be derived from, for example, a pressure sensitive adhesive (PSA), but the present disclosure is not limited thereto.

In an embodiment, the polishing pad 100 may include a penetration region (not shown) penetrating the uppermost surface and the lowermost surface thereof. The penetration region, as a configuration for detecting a polishing end point during use of the polishing pad, may exhibit a transmittance of a certain level or more with respect to light of a predetermined wavelength condition. In an embodiment, a light transmission window may be disposed in the penetration region through at least a portion of the total thickness thereof. For example, the light transmission window may have a transmittance of more than about 30%, for example, about 40% to about 80%, for light of any one wavelength of wavelengths of about 500 nm to about 700 nm.

In an embodiment, the polishing layer 20 may contain a cured product of a preliminary composition comprising a urethane-based prepolymer. In an embodiment, the preliminary composition may further comprise a curing agent and a foaming agent. In the present specification, the term 'prepolymer' refers to a polymer having a relatively low molecular weight in which the polymerization degree is stopped at an intermediate stage to facilitate molding in the production of a cured product. The prepolymer itself may undergo an additional curing process or may be reacted with another polymerizable compound and then molded into a final cured product.

In an embodiment, the urethane-based prepolymer may be manufactured by reacting an isocyanate compound with a polyol compound.

The isocyanate compound used in manufacturing of the urethane-based prepolymer may include one selected from the group consisting of aromatic diisocyanate, aliphatic diisocyanate, alicyclic diisocyanate, and combinations thereof. For example, the isocyanate compound may include aromatic diisocyanate, and for example, the isocyanate compound may include aromatic diisocyanate and alicyclic diisocyanate.

The isocyanate compound may include, for example, one selected from the group consisting of 2,4-toluenediisocyanate (2,4-TDI), 2,6-toluenediisocyanate (2,6-TDI), naphthalene-1,5-diisocyanate, p-phenylenediisocyanate, tolidine diisocyanate, 4,4'-diphenylmethanediisocyanate, hexamethylene diisocyanate, dicyclohexylmethane diisocyanate, 4,4'-dicyclohexylmethane diisocyanate ($H_{12}MDI$), isophorone diisocyanate, and combinations thereof.

The 'polyol' refers to a compound containing at least two hydroxyl groups (—OH) per molecule. In an embodiment, the polyol compound may include: a dihydric alcohol compound having two hydroxyl groups, that is, diol or glycol; or a trihydric alcohol compound having three hydroxyl groups, that is, a triol compound.

The polyol compound may include, for example, one selected from the group consisting of polyether-based polyols, polyester-based polyols, polycarbonate-based polyols, acrylic polyols, and combinations thereof.

The polyol compound may include, for example, one selected from the group consisting of polytetramethylene ether glycol (PTMG), polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol (DEG), dipropylene glycol (DPG), tripropylene glycol, polypropylene glycol, polypropylene triol, and combinations thereof.

The polyol compound may have a weight average molecular weight (Mw) of about 100 g/mol to about 3,000 g/mol. For example, the polyol compound may have a weight average molecular weight (Mw) of about 100 g/mol to about 3,000 g/mol, for example, about 100 g/mol to about 2,000 g/mol, for example, about 100 g/mol to about 1,800 g/mol.

In an embodiment, the polyol compound may include a low molecular weight polyol having a weight average molecular weight (Mw) of about 100 g/mol or more and less than about 300 g/mol, and a high molecular weight polyol having a weight average molecular weight (Mw) of about 300 g/mol or more and about 1800 g/mol or less. The high molecular weight polyol may have a weight average molecular weight (Mw) of, for example, about 500 g/mol or more and about 1,800 g/mol or less, for example, about 700 g/mol or more and about 1,800 g/mol or less. In this case, the polyol compound may form an appropriate crosslinked structure in the urethane-based prepolymer, and the polishing layer formed by curing the preliminary composition comprising the urethane-based prepolymer under predetermined process conditions may be more advantageous to realize the above-described effect.

The urethane-based prepolymer may have a weight average molecular weight (Mw) of about 500 g/mol to about 3,000 g/mol. The urethane-based prepolymer may have a weight average molecular weight (Mw) of, for example, about 600 g/mol to about 2,000 g/mol, for example, about 800 g/mol to about 1,000 g/mol. When the urethane-based prepolymer has a degree of polymerization corresponding to the above-described weight average molecular weight (Mw), the polishing layer formed by curing the preliminary composition under predetermined process conditions may be more advantageous to have a chemical bonding structure for realizing the excellent polishing properties described above.

In an embodiment, the isocyanate compound for producing the urethane-based prepolymer may include an aromatic diisocyanate compound, and the aromatic diisocyanate compound may include, for example, 2,4-toluenediisocyanate (2,4-TDI) and 2,6-toluenediisocyanate (2,6-TDI). Further, the polyol compound for producing the urethane-based prepolymer may include polytetramethylene ether glycol (PTMG) and diethylene glycol (DEG).

In another embodiment, the isocyanate compound for producing the urethane-based prepolymer may include an aromatic diisocyanate compound and an alicyclic diisocyanate compound, and for example, the aromatic diisocyanate compound may include 2,4-toluenediisocyanate (2,4-TDI) and 2,6-toluenediisocyanate (2,6-TDI), and the alicyclic diisocyanate compound may include 4,4'-dicyclohexylmethane diisocyanate ($H_{12}$MDI). Further, the polyol compound for producing the urethane-based prepolymer may include polytetramethylene ether glycol (PTMG) and diethylene glycol (DEG).

Polytetramethylene ether glycol (PTMG) may be contained in an amount of about 100 parts by weight to about 150 parts by weight, for example, about 105 parts by weight to about 140 parts by weight, for example, about 110 parts by weight to about 140 parts by weight, for example, about 120 parts by weight to about 140 parts by weight based on 100 parts by weight of the total weight of the isocyanate compound.

Diethylene glycol (DEG) may be contained in an amount of about 1 parts by weight to about 20 parts by weight, for example, about 1 parts by weight to about 15 parts by weight based on 100 parts by weight of the total weight of the isocyanate compound.

When the isocyanate compound includes the aromatic diisocyanate compound, and the aromatic diisocyanate compound includes 2,4-TDI and 2,6-TDI, 2,6-TDI may be contained in an amount of about 1 parts by weight to about 40 parts by weight, for example, about 1 parts by weight to about 30 parts by weight, for example, about 3 parts by weight to about 28 parts by weight, for example, about 1 parts by weight to about parts by weight, for example, about 20 parts by weight to about 30 parts by weight based on 100 parts by weight of 2,4-TDI.

When the isocyanate compound includes the aromatic diisocyanate compound and the alicyclic diisocyanate compound, the alicyclic diisocyanate compound may be contained in an amount of about 5 parts by weight to about 20 parts by weight, for example, about 5 parts by weight to about 15 parts by weight, for example, about 8 parts by weight to about 13 parts by weight based on 100 parts by weight of the total aromatic diisocyanate compound.

The preliminary composition may have an isocyanate group content (NCO %) of about 5% by weight to about 11% by weight, for example, about 5% by weight to about 10% by weight, for example, about 5% by weight to about 8% by weight, for example, about 8% by weight to about 10% by weight, for example, about 8.5% by weight to about 10% by weight. The 'isocyanate group content' refers to a percentage of the weight of isocyanate groups that are present as free reactive groups without being subjected to the urethane reaction in the total weight of the preliminary composition. The isocyanate group content (NCO %) of the preliminary composition may be designed by comprehensively adjusting the type and content of the isocyanate compound and polyol compound for producing the urethane-based prepolymer, the process conditions such as temperature, pressure, time, etc. of the process of manufacturing the urethane-based prepolymer, and the type, content, etc. of additives used in manufacturing of the urethane-based prepolymer.

In an embodiment, the preliminary composition may further comprise a curing agent and a foaming agent. The curing agent, as a compound for chemically reacting with the urethane-based prepolymer to form a final cured structure in the polishing layer, may include, for example, an amine compound or an alcohol compound. Specifically, the curing agent may include one selected from the group consisting of aromatic amines, aliphatic amines, aromatic alcohols, aliphatic alcohols, and combinations thereof.

For example, the curing agent may include one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis(methyl anthranilate), diaminodiphenylsulfone, m-xylylenediamine, isophorone diamine, ethylenediamine, diethylenetriamine, triethylenetetramine, polypropylene diamine, polypropylene triamine, bis(4-amino-3-chlorophenyl)methane, and combinations thereof.

The curing agent may be contained in an amount of about 18 parts by weight to about 27 parts by weight, for example, about 19 parts by weight to about 26 parts by weight, for example, about 20 parts by weight to about 26 parts by weight based on 100 parts by weight of the preliminary composition. When the content of the curing agent satisfies the above range, it may be more advantageous to realize the desired performance of the polishing pad.

The foaming agent, as a component for forming a pore structure in the polishing layer, may include one selected from the group consisting of a solid-phase foaming agent, a gas-phase foaming agent, a liquid-phase foaming agent, and combinations thereof. In an embodiment, the foaming agent may include a solid-phase foaming agent, a gas-phase foaming agent, or a combination thereof.

The solid-phase foaming agent may have an average particle diameter of about 5 μm to about 200 μm, for example, about 20 μm to about 50 μm, for example, about 21 μm to about 50 μm, for example, about 21 μm to about 40 μm. The average particle diameter of the solid-phase foaming agent may mean the average particle diameter of thermally expanded particles themselves when the solid-phase foaming agent is thermally expanded particles as described later, and may mean the average particle diameter of particles after being expanded by heat or pressure when the solid-phase foaming agent is unexpanded particles as described later.

The solid-phase foaming agent may comprise expandable particles. The expandable particles are particles having a property of being expandable by heat, pressure or the like, and the size thereof in the final polishing layer may be determined by heat, pressure, or the like applied in the process of manufacturing the polishing layer. The expandable particles may include thermally expanded particles, unexpanded particles, or a combination thereof. The thermally expanded particles, as particles pre-expanded by heat, refer to particles having little or no size change due to heat or pressure applied during the manufacturing process of the polishing layer. The unexpanded particles, as particles that are not expanded in advance, refer to particles that are expanded by heat or pressure applied during the manufacturing process of the polishing layer so that their final size is determined.

The expandable particles may include: a shell made of a resin material; and an expansion-causing component that is present in the interior encapsulated by the shell.

For example, the shell may contain a thermoplastic resin, and the thermoplastic resin may be one or more selected from the group consisting of a vinylidene chloride-based copolymer, an acrylonitrile-based copolymer, a methacrylonitrile-based copolymer, and an acrylic copolymer.

The expansion-causing component may include one selected from the group consisting of a hydrocarbon compound, a chlorofluoro compound, a tetraalkylsilane compound, and combinations thereof.

Specifically, the hydrocarbon compound may include one selected from the group consisting of ethane, ethylene, propane, propene, n-butane, isobutane, n-butene, isobutene, n-pentane, isopentane, neopentane, n-hexane, heptane, petroleum ether, and combinations thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

The solid-phase foaming agent may optionally comprise inorganic component-treated particles. For example, the solid-phase foaming agent may comprise inorganic component-treated expandable particles. In an embodiment, the solid-phase foaming agent may comprise silica ($SiO_2$) particle-treated expandable particles. The inorganic component treatment of the solid-phase foaming agent can prevent agglomeration between a plurality of particles. The inorganic component-treated solid-phase foaming agent may have chemical, electrical, and/or physical properties on the foaming agent surface different from those of an inorganic component-untreated solid-phase foaming agent.

The solid-phase foaming agent may be contained in an amount of about 0.5 parts by weight to about 10 parts by weight, for example, about 1 parts by weight to about 3 parts by weight, for example, about 1.3 parts by weight to about 2.7 parts by weight, for example, about 1.3 parts by weight to about 2.6 parts by weight based on 100 parts by weight of the urethane-based prepolymer.

The type and content of the solid-phase foaming agent may be designed depending on the desired pore structure and physical properties of the polishing layer.

The gas-phase foaming agent may comprise an inert gas. The gas-phase foaming agent may be used as a pore-forming element by being injected in a process that the urethane-based prepolymer and the curing agent are reacted.

The type of inert gas is not particularly limited as long as the inert gas is a gas that does not participate in a reaction between the urethane-based prepolymer and the curing agent. For example, the inert gas may include one selected from the group consisting of nitrogen gas ($N_2$), argon gas (Ar), helium gas (He), and combinations thereof. Specifically, the inert gas may include nitrogen gas ($N_2$) or argon gas (Ar).

The type and content of the gas-phase foaming agent may be designed depending on the desired pore structure and physical properties of the polishing layer.

In an embodiment, the foaming agent may include a solid-phase foaming agent. For example, the foaming agent may consist of only a solid-phase foaming agent.

The solid-phase foaming agent may comprise expandable particles, and the expandable particles may include thermally expanded particles. For example, the solid-phase foaming agent may be comprised of only thermally expanded particles. When it is comprised of only the thermally expanded particles without comprising the unexpanded particles, the variability of the pore structure is lowered, but the predictability is increased so that it may be advantageous to implement homogeneous pore properties over the entire area of the polishing layer.

In an embodiment, the thermally expanded particles may be particles having an average particle diameter of about 5 μm to about 200 μm. The thermally expanded particles may have an average particle diameter of about 5 μm to about 100 μm, for example, about 10 μm to about 80 μm, for example, about 20 μm to about 70 μm, for example, about 20 μm to about 50 μm, for example, about 30 μm to about 70 μm, for example, about 25 μm to about 45 μm, for example, about 40 μm to about 70 μm, for example, about 40 μm to about 60 μm. The average particle diameter is defined as D50 of the thermally expanded particles.

In an embodiment, the thermally expanded particles may have a density of about 30 kg/m³ to about 80 kg/m³, for example, about 35 kg/m³ to about 80 kg/m³, for example, about 35 kg/m³ to about 75 kg/m³, for example, about 38 kg/m³ to about 72 kg/m³, for example, about 40 kg/m³ to about 75 kg/m³, for example, about 40 kg/m³ to about 72 kg/m³.

In an embodiment, the foaming agent may include a gas-phase foaming agent. For example, the foaming agent may include a solid-phase foaming agent and a gas-phase foaming agent. Matters regarding the solid-phase foaming agent are the same as described above.

The gas-phase foaming agent may comprise a nitrogen gas.

The gas-phase foaming agent may be injected through a predetermined injection line while the urethane-based prepolymer, the solid-phase foaming agent, and the curing agent are mixed. The gas-phase foaming agent may have an injection rate of about 0.8 L/min to about 2.0 L/min, for example, about 0.8 L/min to about 1.8 L/min, for example, about 0.8 L/min to about 1.7 L/min, for example, about 1.0 L/min to about 2.0 L/min, for example, about 1.0 L/min to about 1.8 L/min, for example, about 1.0 L/min to about 1.7 L/min.

A composition for producing the polishing layer may further comprise other additives such as a surfactant, a reaction rate adjusting agent, etc. The names such as 'surfactant', 'reaction rate adjusting agent', etc. are names arbitrarily referred to based on the main roles of corresponding substances, and each corresponding substance does not necessarily perform only a function limited to the role by the corresponding name.

The surfactant is not particularly limited as long as it is a material that serves to prevent a phenomenon such as agglomeration, overlapping, or the like of pores. For example, the surfactant may include a silicone-based surfactant.

The surfactant may be contained in an amount of about 0.2 parts by weight to about 2 parts by weight based on 100 parts by weight of the urethane-based prepolymer. Specifically, the surfactant may be contained in an amount of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to about 1.5 parts by weight based on 100 parts by weight of the urethane-based prepolymer. When the surfactant is contained within the above range, pores derived from the gas-phase foaming agent may be stably formed and maintained in the mold.

The reaction rate adjusting agent serves to promote or delay the reaction, and a reaction accelerator, a reaction retarder, or both thereof may be used depending on the purpose. The reaction rate adjusting agent may comprise a reaction accelerator. For example, the reaction accelerator may be one or more reaction accelerators selected from the group consisting of a tertiary amine-based compound and an organometallic compound.

Specifically, the reaction rate adjusting agent may include one or more selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl)ether, trimethylaminoethylethanolamine, N,N,N',N'',N''-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanorbornene, dibutyltin dilaurate, stannous octoate, dibutyltin diacetate, dioctyltin diacetate, dibutyltin maleate, dibutyltin di(2-ethylhexanoate), and dibutyltin dimercaptide. Specifically, the reaction rate adjusting agent may include one or more selected from the group consisting of benzyldimethylamine, N,N-dimethylcyclohexylamine, and triethylamine.

The reaction rate adjusting agent may be used in an amount of about 0.05 parts by weight to about 2 parts by weight based on 100 parts by weight of the urethane-based prepolymer. Specifically, the reaction rate adjusting agent may be used in an amount of about 0.05 parts by weight to about 1.8 parts by weight, for example, about 0.05 parts by weight to about 1.7 parts by weight, for example, about 0.05 parts by weight to about 1.6 parts by weight, for example, about 0.1 parts by weight to about 1.5 parts by weight, for example, about 0.1 parts by weight to about 0.3 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to about 1 parts by weight based on 100 parts by weight of the urethane-based prepolymer. When the reaction rate adjusting agent is used in the aforementioned amount range, a polishing layer having desired sized pores and hardness may be formed by appropriately adjusting the curing reaction rate of the preliminary composition.

The cushion layer derived from the polishing pad sheet may have a thickness of about 0.5 mm to about 2.5 mm, for example, about 0.8 mm to about 2.5 mm, for example, about 1.0 mm to about 2.5 mm, for example, about 1.0 mm to about 2.0 mm, for example, about 1.2 mm to about 1.8 mm.

In an embodiment, the polishing layer and the cushion layer may have a density difference of about 0.30 $g/cm^3$ to about 0.50 $g/cm^3$, for example, about 0.30 $g/cm^3$ to about 0.45 $g/cm^3$, for example, about 0.30 $g/cm^3$ to about 0.40 $g/cm^3$. When the polishing pad sheet satisfying the value of Equation 1 above in the aforementioned range is applied as the cushion layer, and at the same time, when the density difference between the polishing layer and the cushion layer satisfies the above range, appropriate polishing rigidity and elasticity may be provided with respect to a polishing object to be polished under pressure conditions through the polishing surface of the polishing layer, and as a result, it may be more advantageous in terms of improvement in polishing rate and prevention of defects.

In an embodiment, the polishing layer may have a surface hardness of about 40 to about 70, for example, about 40 to about 65 based on Shore D hardness. As the surface hardness of the polishing surface 13 of the polishing layer 20 satisfies the above range based on the Shore D hardness while applying the polishing pad sheet 10 satisfying the condition of Equation 1 above as the cushion layer, the polishing rate may be achieved in an optimal range during the polishing process to which the polishing pad is applied, and it may be more advantageous to have an excellent scratch reduction effect and to implement an equivalent level of polishing performance for a long time.

Meanwhile, when the surface hardness of the polishing surface 13 of the polishing layer 20 satisfies the above range based on the Shore D hardness while applying the polishing pad sheet 10 having a surface hardness of about 60 to about 90 measured on the first surface 11 as an object based on Asker C hardness as the cushion layer, an appropriate surface frictional force may be provided with respect to a surface to be polished of the polishing object during the polishing process to which the polishing pad is applied.

In an embodiment, the polishing layer 20 may have a tensile strength of about 10 $N/mm^2$ to about 30 $N/mm^2$, for example, about 10 $N/mm^2$ to about 25 $N/mm^2$. When the tensile strength of the polishing layer 20 satisfies the above range while applying the polishing pad sheet 10 in which the value of Equation 1 above satisfies the aforementioned range as the cushion layer, the cushion layer may provide appropriate elasticity and rigidity to the surface to be polished of the polishing object through the polishing layer, and as a result, it may be more advantageous in terms of improvement in polishing rate and reduction of defects.

In an embodiment, the polishing layer 20 may have an elongation of about 90% to about 250%, for example, about 100% to about 250%, for example, more than about 100% to about 250% or less. When the elongation of the polishing layer 20 satisfies the above range while applying the polishing pad sheet 10 in which the value of Equation 1 above satisfies the aforementioned range as the cushion layer, the cushion layer may provide appropriate elasticity and rigidity to the surface to be polished of the polishing object through the polishing layer, and as a result, it may be more advantageous in terms of achieving an optimal range of polishing rate and preventing defects.

In an embodiment, a compressibility (%) value calculated from the equation of (D1−D2)/D1×100 by collecting a specimen measuring 25 mm in width and length each with respect to the entire laminated structure of the polishing pad, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed may be about 1.0% to about 1.5%, for example, about 1.0% to about 1.2%. In the case that the polishing pad sheet 10 in which the value of Equation 1 above satisfies the aforementioned range is applied as the cushion layer, and at the same time, the total compressibility (%) of the polishing pad including the polishing layer 20 and the cushion layer satisfies the above range, when the polishing object, for example, a semiconductor substrate, is press-polished under a predetermined pressure condition during the polishing process to which the polishing pad is applied, appropriate physical/mechanical stimulation may be given to the surface to be polished of the polishing object. Accordingly, it may be advantageous to optimize the surface properties of the polishing-completed surface to be polished, and to remarkably reduce the defect rate of the polishing process.

Hereinafter, a method for manufacturing the polishing pad will be described in detail.

The polishing pad may be manufactured through a manufacturing method comprising the steps of: manufacturing a polishing layer including a polishing surface and a rear surface thereof; manufacturing a polishing pad sheet, including a first surface which is a polishing layer attachment surface and a second surface which is a rear surface of the first surface; and attaching the first surface of the polishing pad sheet to the rear surface of the polishing layer.

The step of manufacturing the polishing layer may comprise the steps of: preparing a preliminary composition comprising a prepolymer; preparing a composition for manufacturing a polishing layer, comprising the preliminary composition, a foaming agent, and a curing agent; and manufacturing a polishing layer by curing the composition for manufacturing the polishing layer.

The step of preparing the preliminary composition may be a process of manufacturing a urethane-based prepolymer by reacting a diisocyanate compound and a polyol compound. Matters regarding the diisocyanate compound and the polyol compound are the same as those described above with respect to the polishing pad.

The preliminary composition may have an isocyanate group content (NCO %) of about 5% by weight to about 11% by weight, for example, about 5% by weight to about 10% by weight, for example about 5% by weight to about 8% by weight, for example, about 8% by weight to about 10% by weight. The isocyanate group content in the preliminary composition may be derived from terminal isocyanate groups of the urethane-based prepolymer, unreacted isocyanate groups that have not been reacted in the diisocyanate compound, etc. The isocyanate group content (NCO %) means % by weight of the isocyanate group (—NCO) in 100% by weight of the total preliminary composition.

The preliminary composition may have a viscosity of about 100 cps to about 1,000 cps, for example, about 200 cps to about 800 cps, for example, about 200 cps to about 600 cps, for example, about 200 cps to about 550 cps, for example, about 300 cps to about 500 cps at about 80° C.

The foaming agent may include a solid-phase foaming agent or a gas-phase foaming agent. Matters regarding the solid-phase foaming agent and the gas-phase foaming agent are the same as those described above with respect to the polishing pad.

When the foaming agent includes a solid-phase foaming agent, the step of preparing the composition for manufacturing a polishing layer may comprise the steps of: preparing a first preliminary composition by mixing the preliminary composition and the solid-phase foaming agent; and preparing a second preliminary composition by mixing the first preliminary composition and the curing agent.

The first preliminary composition may have a viscosity of about 1,000 cps to about 2,000 cps, for example, about 1,000 cps to about 1,800 cps, for example, about 1,000 cps to about 1,600 cps, for example, about 1,000 cps to about 1,500 cps at about 80° C.

When the foaming agent includes a gas-phase foaming agent, the step of preparing the composition for manufacturing the polishing layer may comprise the steps of: preparing a third preliminary composition comprising the preliminary composition and the curing agent; and preparing a fourth preliminary composition by injecting the gas-phase foaming agent into the third preliminary composition.

In an embodiment, the third preliminary composition may further comprise the solid-phase foaming agent.

In an embodiment, the process of manufacturing the polishing layer may comprise the steps of: preparing a mold preheated to a first temperature; producing a cured body by injecting the composition for manufacturing the polishing layer into the preheated mold; and post-curing the cured body under a second temperature condition higher than the preheating temperature.

In an embodiment, the first temperature and the second temperature may have a temperature difference of about 10° C. to about 40° C., for example, about 10° C. to about 35° C., for example, about 15° C. to about 35° C.

In an embodiment, the first temperature may be about 60° C. to about 100° C., for example, about 65° C. to about 95° C., for example, about 70° C. to about 90° C.

In an embodiment, the second temperature may be about 100° C. to about 130° C., for example, about 100° C. to about 125° C., for example, from about 100° C. to about 120° C.

The step of curing the composition for manufacturing a polishing layer under the first temperature may be performed for about 5 minutes to about 60 minutes, for example, about 5 minutes to about 40 minutes, for example, about 5 minutes to about 30 minutes, for example, about 5 minutes to about 25 minutes.

The step of post-curing the composition for manufacturing the polishing layer, cured under the first temperature, under the second temperature may be performed for about 5 hours to about 30 hours, for example, about 5 hours to about 25 hours, for example, about 10 hours to about 30 hours, for example, about 10 hours to about 25 hours, for example, about 12 hours to about 24 hours, for example, about 15 hours to about 24 hours.

The step of manufacturing the polishing layer may further comprise a step of processing the polishing surface.

The step of processing the polishing surface may comprise at least one of the steps of: forming grooves or indentations on the polishing surface; line-turning the polishing surface; and roughening the polishing surface.

The grooves or indentations may be formed in at least one form of: concentric circular shapes formed to be spaced apart from the center of the polishing surface at a predetermined interval; and radial shapes continuously connected from the center of the polishing surface to an edge of the polishing surface.

The line turning may be performed by a method of cutting the polishing surface by a predetermined thickness using a cutting tool.

The roughening may be performed by a method of processing the polishing surface with a sanding roller.

The step of manufacturing of the polishing pad sheet including the second surface which is the rear surface of the first surface may be performed in the same manner as the above-described method for manufacturing the polishing pad sheet.

The step of attaching the first surface of the polishing pad sheet to the rear surface of the polishing layer may be a step of attaching through a heat-sealing adhesive as a medium. Matters regarding the heat-sealing adhesive are the same as described above. In an embodiment, the step may be performed by a method of applying the heat-sealing adhesive to the first surface of the polishing pad sheet, applying the heat-sealing adhesive to the rear surface of the polishing surface of the polishing layer, stacking the polishing layer and the polishing pad sheet so that the respective surfaces thereof to which the heat-sealing adhesive has been applied are in contact with each other, and fusing them using a pressure roller. It may be advantageous to secure a desired level of interfacial adhesion by applying a heat-sealing adhesive to the first surface of the polishing pad sheet and the rear surface of the polishing layer respectively, and then reciprocally attaching them to each other. Further, it may be advantageous for the polishing pad to secure long-term durability that implements excellent mechanical rigidity without generating bubbles or tear during a polishing process in a wet environment lasting for several tens of hours.

In another embodiment, there is a provided a method for manufacturing a semiconductor device, the method comprising the steps of: providing a polishing pad including a polishing layer and a cushion layer; and disposing a polishing surface of the polishing layer to be in contact with a surface to be polished of a polishing object and then polishing the polishing object while rotating them relative to each other under a pressurized condition, wherein the polishing object includes a semiconductor substrate, the cushion layer is derived from a polishing pad sheet, the polishing pad sheet includes: a first surface which is a polishing layer attachment surface; and a second surface which is a rear surface of the first surface, the first surface has a value of Equation 1 below of 4.20 to 5.50, and the first surface has an adhesive force to the polishing layer of 8.00 kgf/25 mm or more.

$$\frac{|Sv|}{Sz} \times P(\%) \qquad \text{[Equation 1]}$$

where, Sv is a maximum pit height roughness value of the first surface, Sz is a maximum height roughness value of the first surface, and P is a compressibility (%) value calculated from the equation of $(D1-D2)/D1 \times 100$ by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

In matters regarding the polishing layer and the polishing pad sheet, both of the aforementioned specific details regarding the polishing pad and technical advantages thereof may be equally integrally applied to the method for manufacturing the semiconductor device. The method for manufacturing the semiconductor device may obtain an effect of maintaining excellent polishing performance without replacing the polishing pad for a long time by applying a polishing pad including the polishing layer and a cushion layer derived from the polishing pad sheet, and the semiconductor substrate manufactured through this may provide an excellent function to a final semiconductor device.

FIG. 4 is a schematic diagram schematically illustrating the method for manufacturing the semiconductor device according to an embodiment. Referring to FIG. 4, in the step of providing the polishing pad, the polishing pad 110 may be disposed and provided on a surface plate 120.

The polishing object includes a semiconductor substrate. The semiconductor substrate 130 may be disposed such that a surface to be polished thereof is in contact with a polishing surface of a polishing layer of the polishing pad 110. At this time, the surface to be polished of the semiconductor substrate 130 and the polishing surface of the polishing layer may be in direct contact, or indirect contact with each other through a slurry with fluidity or the like as a medium.

In an embodiment, the method for manufacturing the semiconductor device may further comprise a step of supplying a polishing slurry 150 to the polishing surface of the polishing layer of the polishing pad 110. For example, the polishing slurry 150 may be supplied onto the polishing surface through a supply nozzle 140.

The flow rate of the polishing slurry 150 injected through the supply nozzle 140 may be about 10 ml/min to about 1,000 ml/min, for example, about 10 ml/min to about 800 ml/min, for example, about 50 ml/min to about 500 ml/min, but the present disclosure is not limited thereto.

The polishing slurry 150 may include a silica slurry or a ceria slurry, but the present disclosure is not limited thereto.

The semiconductor substrate 130 may be polished while being pressed against the polishing surface 11 by a predetermined load in a state that it is mounted on a polishing head 160. The surface to be polished of the semiconductor substrate 130 pressurized on the polishing surface by the polishing head 160 may have a load selected according to the purpose, for example, in a range of about 0.01 psi to about 20 psi, for example, about 0.1 psi to about 15 psi, but the present disclosure is not limited thereto. When the polishing surface of the polishing layer and the surface to be polished of the semiconductor substrate are in contact with each other under the above-described load, a laminate of the polishing layer and the cushion layer derived from the polishing pad sheet may exhibit appropriate compressive properties and elasticity as a whole with respect to the semiconductor substrate, and accordingly, it may be advantageous for the polishing rate and defect prevention effect of the semiconductor substrate to be realized at the desired level.

The semiconductor substrate 130 and the polishing pad 110 may be rotated relative to each other in a state that the respective surface to be polished and polishing surface thereof are in contact with each other. At this time, the rotation direction of the semiconductor substrate 130 and the rotation direction of the polishing pad 110 may be the same direction or opposite directions. The semiconductor substrate 130 and the polishing pad 110 may each have a rotational speed selected according to the purpose in a range of about 10 rpm to about 500 rpm, for example, about 30 rpm to about 200 rpm, but the present disclosure is not limited thereto. When each rotational speed of the semiconductor substrate and the polishing pad respectively satisfies the above ranges, a laminate of the polishing layer and the cushion layer derived from the polishing pad sheet exhibits appropriate compressive properties and elasticity, and a contact area per hour corresponding to this may be provided to the surface to be polished of the semiconductor substrate, and accordingly, it may be advantageous for the polishing rate and the defect prevention effect of the semiconductor substrate to be realized at an equal level during the target process time.

In an embodiment, in order to maintain the polishing surface of the polishing pad 110 in a state suitable for polishing, the method for manufacturing the semiconductor device may further comprise a step of processing the polishing surface of the polishing pad 110 through the conditioner 170 simultaneously along with polishing of the semiconductor substrate 130.

In an embodiment, in the method for manufacturing the semiconductor device, the semiconductor substrate includes a silicon oxide ($SiO_2$) film, the surface to be polished is a surface of the silicon oxide ($SiO_2$) film, and the silicon oxide ($SiO_2$) film may have an average polishing rate of about 1,500 Å/min to about 3,000 Å/min. For example, the silicon oxide ($SiO_2$) film may have an average polishing rate of about 1,500 Å/min to about 3,000 Å/min, for example, about 2,500 Å/min to about 3,000 Å/min.

In the method for manufacturing the semiconductor device, the semiconductor substrate may include a silicon oxide ($SiO_2$) film, the surface to be polished may be a surface of the silicon oxide ($SiO_2$) film, and the surface to be polished may have a polishing flatness after completing polishing thereon of less than about 5%, for example, less than about 4.8%, for example, about 0% or more and less than about 4.8%.

In the method for manufacturing the semiconductor device, the semiconductor substrate may include a silicon oxide ($SiO_2$) film, the surface to be polished may be a surface of the silicon oxide ($SiO_2$) film, and the surface to be polished may have surface defects thereon of less than about 5, for example, less than about 4, for example, less than about 3.

The method for manufacturing the semiconductor device may achieve the process efficiency that does not require replacement of the polishing pad even during polishing for several tens of hours by applying a polishing pad provided with a polishing layer having the above-described characteristics, thereby using a semiconductor substrate having a silicon oxide ($SiO_2$) film, as a polishing object. For example, the method for manufacturing the semiconductor device may be characterized in that there are: no interfacial desorption between the polishing layer and the cushion layer; no bubble generation on the polishing surface; or no tear, in the polishing pad after performing polishing for 50 hours under predetermined polishing conditions.

Hereinafter, specific Examples of the present disclosure are presented. However, Examples described below are only for specifically exemplifying or explaining the present disclosure, and thus the present disclosure is not limited thereto.

MANUFACTURING EXAMPLE

Manufacturing Example 1-1: Manufacturing of Polishing Layer (1)

A preliminary composition comprising a urethane-based prepolymer was prepared by mixing a diisocyanate component and a polyol component at a composition ratio shown in Table 1 below, injecting the mixture into a four-neck flask, and reacting it at 80° C. An isocyanate group (NCO group) content in the preliminary composition was adjusted to 9% by weight. 4,4'-methylenebis(2-chloroaniline) (MOCA) as a curing agent was mixed in the preliminary composition so that the molar ratio of $NH_2$ groups of MOCA to NCO groups in the preliminary composition became 0.96. Further, a solid foaming agent (Akzonobel Corporation), which was expandable particles, was mixed with the preliminary composition in an amount of 1.0 parts by weight. The preliminary composition was injected into a mold having a width of 1,000 mm, a length of 1,000 mm, and a height of 3 mm preheated to 90° C. at a discharge rate of 10 kg/min, and at the same time, a nitrogen ($N_2$) gas as a gas-phase foaming agent was injected at an injection rate of 1.0 L/min for the same time as the casting time. Subsequently, the preliminary composition was subjected to a post-curing reaction under a temperature condition of 110° C. to manufacture a polishing layer.

Manufacturing Example 1-2: Manufacturing of Polishing Layer (2)

A preliminary composition comprising a urethane-based prepolymer was prepared by mixing a diisocyanate component and a polyol component at a composition ratio shown in Table 1 below, injecting the mixture into a four-neck flask, and reacting it at 80° C. An isocyanate group (NCO group) content in the preliminary composition was adjusted to 6% by weight. 4,4'-methylenebis(2-chloroaniline) (MOCA) as a curing agent was mixed in the preliminary composition so that the molar ratio of $NH_2$ groups of MOCA to NCO groups in the preliminary composition became 0.75. Further, a solid foaming agent (AkzoNobel Corporation), which was expandable particles, was mixed with the preliminary composition in an amount of 1.0 parts by weight. The preliminary composition was injected into a mold having a width of 1,000 mm, a length of 1,000 mm, and a height of 3 mm preheated to 90° C. at a discharge rate of 10 kg/min. Subsequently, the preliminary composition was subjected to a post-curing reaction under a temperature condition of 110° C. to manufacture a polishing layer.

TABLE 1

| Item | | | Manufacturing Example 1-1 | Manufacturing Example 1-2 |
|---|---|---|---|---|
| Preliminary composition | Diisocyanate | 2,4-TDI | 73 | 96 |
| | | 2,6-TDI | 17 | 4 |
| | | $H_{12}MDI$ | 10 | — |
| | | Total | 100 | 100 |
| | Polyol | PTMG (Mw 1000) | 90.8 | 90.0 |
| | | DEG (Mw 106) | 9.2 | 10.0 |
| | | Total | 100 | 100 |
| | NOC group content (% by weight) of preliminary composition | | 9 | 6 |

TABLE 1-continued

| Item | | Manufacturing Example 1-1 | Manufacturing Example 1-2 |
|---|---|---|---|
| Amine curing agent | Molar ratio of $NH_2$ of curing agent to NCO in preliminary composition | 0.96 | 0.75 |
| Process conditions | Prepolymer manufacturing reaction temperature (° C.) | 80 | 80 |
| | Curing mold preheating temperature (° C.) | 90 | 90 |
| | Post-curing temperature (° C.) | 110 | 110 |
| Properties | Hardness (Shore D) | 58.4 | 43 |
| | Tensile strength ($N/mm^2$) | 21.4 | 14.5 |
| | Elongation (%) | 94.4 | 230.8 |
| | Density ($g/cm^2$) | 0.80 | 0.80 |

Manufacturing Example 2-1: Manufacturing of Sheet (1) for Polishing Pad

A sheet having a total thickness of 1.6 mm was manufactured by impregnating a polyester fiber nonwoven fabric with a polyurethane resin and then drying it. Subsequently, a polishing pad sheet, satisfying the physical properties as shown in Table 2 below, was manufactured.

Manufacturing Example 2-2: Manufacturing of Sheet (2) for Polishing Pad

A sheet having a total thickness of 1.4 mm was manufactured by impregnating a polyester fiber nonwoven fabric with a polyurethane resin and then drying it. Subsequently, a polishing pad sheet, satisfying the physical properties as shown in Table 2 below, was manufactured.

Manufacturing Example 2-3: Manufacturing of Sheet (3) for Polishing Pad

A sheet having a total thickness of 1.0 mm was manufactured by impregnating a polyester fiber nonwoven fabric with a polyurethane resin and then drying it. Subsequently, a polishing pad sheet, satisfying the physical properties as shown in Table 2 below, was manufactured.

Manufacturing Example 2-4: Manufacturing of Sheet (4) for Polishing Pad

A sheet having a total thickness of 1.6 mm was manufactured by impregnating a polyester fiber nonwoven fabric with a polyurethane resin and then drying it. Subsequently, a polishing pad sheet, satisfying the physical properties as shown in Table 2 below, was manufactured by applying a coating composition comprising the same polyurethane resin to one surface of the sheet a dipping method, thereby forming a coating layer having a thickness of 150 μm.

Manufacturing Example 2-5: Manufacturing of Sheet (5) for Polishing Pad

A sheet having a total thickness of 1.4 mm was manufactured by impregnating a polyester fiber nonwoven fabric with a polyurethane resin and then drying it. Subsequently, a polishing pad sheet, satisfying the physical properties as shown in Table 2 below, was manufactured by applying a coating composition comprising the same polyurethane resin to one surface of the sheet a dipping method, thereby forming a coating layer having a thickness of 150 μm.

Manufacturing Example 2-6: Manufacturing of Sheet (6) for Polishing Pad

A sheet having a total thickness of 1.0 mm was manufactured by impregnating a polyester fiber nonwoven fabric with a polyurethane resin and then drying it. Subsequently, a polishing pad sheet, satisfying the physical properties as shown in Table 2 below, was manufactured by applying a coating composition comprising the same polyurethane resin to one surface of the sheet a dipping method, thereby forming a coating layer having a thickness of 150 μm.

TABLE 2

| | Item | Manufacturing Example 2-1 | Manufacturing Example 2-2 | Manufacturing Example 2-3 | Manufacturing Example 2-4 | Manufacturing Example 2-5 | Manufacturing Example 2-6 |
|---|---|---|---|---|---|---|---|
| Structure | Total thickness of nonwoven fabric | 1.6 mm | 1.4 mm | 1.0 mm | 1.6 mm | 1.4 mm | 1.0 mm |
| | Thickness of coating layer | — | — | — | 150 μm | 150 μm | 150 μm |
| Properties | Density [$g/cm^3$] | 0.361 | 0.370 | 0.375 | 0.435 | 0.470 | 0.400 |
| | Hardness (Asker C) | 69 | 73 | 74 | 68 | 70 | 73 |
| | Sa | 29.021 | 34.304 | 34.674 | 33.095 | 37.518 | 30.185 |
| | Sv | −154.89 | −153.6 | −269.6 | −99.53 | −111.43 | −92.99 |
| | Sz | 293.77 | 390.18 | 409.33 | 206.88 | 299.6 | 245.46 |
| | Compressibiliy (%) | 10.87 | 10.61 | 10.55 | 12.48 | 15.14 | 19.18 |
| | |Sv|/Sz * Compressibility (%) | 5.73 | 4.18 | 6.95 | 4.23 | 4.32 | 4.36 |
| | |Sv|/Sz | 0.53 | 0.39 | 0.66 | 0.34 | 0.29 | 0.23 |
| | Sa/Sz * Compressibility (%) | 1.07 | 0.93 | 0.89 | 2.12 | 1.90 | 2.36 |
| | Sa/Sz | 0.10 | 0.09 | 0.08 | 0.17 | 0.13 | 0.12 |

EXAMPLES AND COMPARATIVE EXAMPLES

In order to manufacture the polishing pads of Examples 1 to 6 and Comparative Examples 1 to 6, combinations of the polishing layers and the polishing pad sheets of Manufacturing Examples above were selected as shown in Table 4 below.

A polyurethane-based adhesive (Youngchang Chemical, HMF 27) as a heat-sealing adhesive was applied to a thickness of 27 µm to the rear surface of the polishing surface of each polishing layer, and the same heat-sealing adhesive was applied to a thickness of 27 µm to the first surface of each polishing pad sheet. Subsequently, after disposing the rear surface of the polishing surface of each polishing layer to be in contact with the first surface of each polishing pad sheet, the two layers were attached by pressurizing them based on the gap of 50% of the arithmetic thickness using a pressure roller under the condition of 120° C. Subsequently, a polishing pad was manufactured by disposing the attached layers under the condition of 25° C. for 24 hours and post-treating them.

Evaluation

After evaluating the physical properties and performance by the following method with respect to each polishing layer of Manufacturing Examples 1-1 to 1-2, each polishing pad sheet of Manufacturing Examples 2-1 to 2-6, and each polishing pad of Examples 1 to 6 and Comparative Examples 1 to 6, the results are shown in Tables 1 and 2 above, and Table 4 below.

Experimental Example 1: Evaluation of Physical Properties of Polishing Layers (1) Hardness (Shore D)

For each polishing layer, after a sample having a size of 5 cm (width)×5 cm (length)×2 mm (thickness) was cut and stored at a temperature of 25° C. for 12 hours, Shore D hardness was measured using a durometer.

(2) Tensile Strength

For each polishing layer, a sample having a size of 4 cm (width)×1 cm (length)×2 mm (thickness) was cut, and the highest strength value just before breaking of the polishing pad was measured at a speed of 50 mm/min using a universal testing machine (UTM).

(3) Elongation

For each polishing layer, after cutting a sample having a size of 4 cm (width)×1 cm (length)×2 mm (thickness) and measuring the maximum amount of deformation just before breaking of the polishing pad at a speed of 50 mm/min using a universal testing machine (UTM), the ratio of the maximum amount of deformation to the initial length was expressed as a percentage (%).

(4) Density

For each polishing layer, after a sample having a size of 2 cm (width)×5 cm (length)×2 mm (thickness) was cut and stored at a temperature of 25° C. for 12 hours, the density was measured using a hydrometer.

Experimental Example 2: Evaluation of Physical Properties of Polishing Pad Sheets (1) Hardness (Asker C)

For each polishing pad sheet, after a sample having a size of 5 cm (width)×5 cm (length)×2 mm (thickness) was cut and stored at a temperature of 25° C. for 12 hours, Asker C hardness was measured using a durometer.

(2) Density

For each polishing pad sheet, after a sample having a size of 2 cm (width)×5 cm (length)×2 mm (thickness) was cut and stored at a temperature of 25° C. for 12 hours, the density was measured using a hydrometer.

(3) Compressibility

For each polishing pad sheet, a compressibility (%) was derived using the equation of $(D1-D2)/D1 \times 100$ by collecting a specimen measuring 25 mm in width and length each, measuring a dial gauge in no-load condition, and then pressing with a standard weight of 85 g to measure the first thickness (D1) when 30 seconds had elapsed, and by setting up a pressure condition in which 800 g of a weight was added to the standard weight and measuring the second thickness (D2) when 3 minutes had elapsed.

(4) Three-Dimensional Surface Roughness

For each polishing pad sheet, the maximum pit height (Sv) roughness, the maximum height (Sz) roughness, and the arithmetical mean height (Sa) as three-dimensional surface roughness values of the first surface were derived using Contour GT (Bruker) as a three-dimensional roughness measurement method.

Experimental Example 3: Evaluation of Physical Properties and Performance of Polishing Pads (1) Compressibility For each polishing pad, a compressibility (%) was derived using the equation of $(D1-D2)/D1 \times 100$ by collecting a specimen measuring 25 mm in width and length each, measuring a dial gauge in no-load condition, and then pressing with a standard weight of 85 g to measure the first thickness (D1) when 30 seconds had elapsed, and by setting up a pressure condition in which 800 g of a weight was added to the standard weight and measuring the second thickness (D2) when 3 minutes had elapsed.

(2) Interfacial Adhesive Force

For each polishing pad, the interfacial adhesive force between each polishing layer and the cushion layer derived from each polishing pad sheet was measured by an 180 degree peel strength method using a universal testing machine (UTM) apparatus. At this time, the specimen was cut to a size of 25 mm (width)×300 mm (length), and the grip position was positioned to have a margin of about 50 mm of each specimen, and measurement was made under a test speed of 300 mm/min.

(3) Polishing Rate

For each polishing pad, polishing was performed under polishing conditions as shown in Table 3 below. The polishing performance was evaluated by inputting two monitoring wafers per hour while continuously performing polishing of the dummy wafer below over time.

TABLE 3

| Classification | Item | Details |
|---|---|---|
| Wafer | Wafer type | PETEOS |
| Dummy | [time/number of times] | 300 s/∞ |
| Break in | Time [minute] | 15 |
| Polishing head and | Polishing head rotation speed [rpm] | 87 |

TABLE 3-continued

| Classification | Item | Details |
|---|---|---|
| surface plate | Polishing head pressure [psi] | 3.5 |
| | Retainer ring pressure [psi] | 9.0 |
| | Surface plate rotation speed [rpm] | 93.0 |
| | Spindle sweep speed [sw/minute] | 19.0 |
| Conditioner | Conditioner type | CI-45 (Saesol Diamond Industrial Co., Ltd.) |
| | Conditioning type | In situ (3005) Ex situ (155) |
| | Conditioner weight [lb] | 6 |
| | Conditioner rotation speed [rpm] | 101.0 |
| | Conditioner sweep speed [sw/minute] | 19.0 |
| Slurry | Type | TSO-12 (Advantech Korea Co., Ltd.) |

More specifically, a polishing pad was attached onto a surface plate, and a wafer with a diameter of 300 mm having a silicon oxide film was accommodated in a carrier connected to the polishing head so as to face the polishing surface of the polishing pad. The silicon oxide film was polished for 60 seconds while supplying the slurry onto the polishing pad at a rate of 250 mL/min. After polishing, the wafer was removed from the carrier, mounted on a rotary spin dryer, washed with distilled water, and dried with nitrogen for 15 seconds. For the dried wafer, changes in the film thickness between before and after polishing were measured using an optical interference type thickness measuring device (SI-F80R, KYENCE). Thereafter, the polishing rate was calculated using the equation below.

Polishing rate (Å/min)=polishing thickness (Å) of silicon wafer/polishing time (min)

(4) Polishing Flatness

For each polishing pad, the polishing process was performed under the same conditions as the above-described polishing rate measurement method, and then in-plane film thicknesses of 98 wafers were measured to derive the polishing flatness (WIWNU: Within Wafer Non Uniformity, %) using the equation of (standard deviation (Å) of the polished thickness/average polishing thickness (Å))×100.

(5) Long-Term Durability

For each polishing pad, the polishing process under the same conditions as the above-described polishing rate measurement method was performed. After the polishing time was set to 50 hours, whether or not bubbles were generated on the polishing surface with respect to the polishing pad after completing polishing, if there was a tear phenomenon of the polishing pad, etc. were visually observed.

TABLE 4

| Classification | Structure Polishing layer | Structure Cushion layer | Laminate compressibility (%) | Interfacial adhesive force [kgf/25 mm] | Silicon oxide film polishing rate [Å/min] | Polishing flatness [%] | Long-term durability |
|---|---|---|---|---|---|---|---|
| Example 1 | Manufacturing Example 1-1 | Manufacturing Example 2-4 | 1.1 | 11.439 | 2775 | 3.4 | No abnormality |
| Example 2 | Manufacturing Example 1-1 | Manufacturing Example 2-5 | 1.0 | 12.281 | 2665 | 4.0 | No abnormality |
| Example 3 | Manufacturing Example 1-1 | Manufacturing Example 2-6 | 0.9 | 14.097 | 2954 | 4.7 | No abnormality |
| Example 4 | Manufacturing Example 1-2 | Manufacturing Example 2-4 | 1.1 | 11.355 | 1830 | 2.3 | No abnormality |
| Example 5 | Manufacturing Example 1-2 | Manufacturing Example 2-5 | 1.0 | 12.191 | 1753 | 3.3 | No abnormality |
| Example 6 | Manufacturing Example 1-2 | Manufacturing Example 2-6 | 0.9 | 14.002 | 1765 | 4.1 | No abnormality |
| Comparative Example 1 | Manufacturing Example 1-1 | Manufacturing Example 2-1 | 1.2 | 7.854 | 2742 | 3.8 | Bubbles |
| Comparative Example 2 | Manufacturing Example 1-1 | Manufacturing Example 2-2 | 1.1 | 11.542 | 2911 | 5.1 | Bubbles |
| Comparative Example 3 | Manufacturing Example 1-1 | Manufacturing Example 2-3 | 1.0 | 9.544 | 2654 | 4.8 | Tear |
| Comparative Example 4 | Manufacturing Example 1-2 | Manufacturing Example 2-1 | 1.2 | 7.453 | 1674 | 2.2 | Bubbles |
| Comparative Example 5 | Manufacturing Example 1-2 | Manufacturing Example 2-2 | 1.1 | 10.123 | 1756 | 2.1 | Bubbles |
| Comparative Example 6 | Manufacturing Example 1-2 | Manufacturing Example 2-3 | 1.0 | 8.921 | 1375 | 3.4 | Bubbles |

Referring to Tables 1 to 4 above, it could be confirmed that the polishing pads of Examples 1 to 6 achieved the target levels in terms of the final polishing performance, that is, polishing rate and polishing flatness, while securing excellent physical properties at the same time in terms of the interfacial adhesion between the polishing layer and the cushion layer and the long-term durability of the polishing layer by applying the polishing pad sheets of Manufacturing Examples 2-4 to 2-6 in which the value of Equation 1 above satisfied a range of about 4.20 to about 5.50, more specifically, about 4.20 to about 4.40 as the cushion layer. On the other hand, it could be confirmed in the polishing pads of Comparative Examples 1 to 6 that the interfacial adhesion between the polishing layer and the cushion layer deteriorated, the average polishing rate for the silicon oxide film did not reach the desired level, they were disadvantageous in terms of the polishing flatness, or process obstacle elements such as bubble generation, tear, and the like occurred in terms of the long-term durability of the polishing layer by applying the polishing pad sheets of Manufacturing Examples 2-1 to 2-3 in which the value of Equation 1 above was less than 4.20 or more than 5.50 as the cushion layer.

More specifically, it could be confirmed in the polishing pads of Comparative Examples 1 and 4 that the interfacial adhesive force between the polishing layer and the cushion layer was shown to be less than 8.00 kgf/25 mm, and an obstacle factor of bubble generation occurred in terms of the long-term durability of the polishing layer by applying the polishing pad sheet having the value of Equation 1 above exceeding about 5.50 as the cushion layer.

Polishing performance deterioration such as the polishing flatness exceeding 5%, the generation of bubbles in terms of the long-term durability of the polishing layer, or the like could be confirmed by applying the polishing pad sheet having the value of Equation 1 above not reaching about 4.20 as the cushion layer in the polishing pads of Comparative Examples 2 and 5.

It could be confirmed in the polishing pads of Comparative Examples 3 and 5 that the interfacial adhesion between the polishing layer and the cushion layer did not reach about 10 kgf/25 mm, the lowest durability such as tearing or the like along with the generation of bubbles was exhibited in terms of the long-term durability of the polishing layer, and lowered polishing performance such as a rather low polishing rate exhibited in terms of the average polishing rate, the polishing flatness that did not satisfy the condition of less than about 4.8%, or the like was exhibited by applying the polishing pad sheet having the remarkably low value of Equation 3 above while having the value of Equation 1 above exceeding about 5.50 as the cushion layer.

As described above, the polishing pad sheet according to an embodiment is applied to the polishing pad so that appropriate elasticity and high durability may be implemented, and a stable polishing process may be possible through this. Further, the polishing pad according to an embodiment, as a polishing pad to which an optimal polishing pad sheet is applied as a cushion layer, may allow the interfacial properties between the polishing layer and the cushion layer to be expressed as optimized physical properties in realizing the overall polishing performance of the polishing pad, may enable the function to be realized without damage even during the polishing process in a wet environment for a long time, and may enable the original function such as the polishing rate or the like to be also excellently implemented.

Furthermore, the method for manufacturing the semiconductor device to which the polishing pad is applied may exhibit high process efficiency in polishing the semiconductor substrate, and in the final polishing result, the surface to be polished of the semiconductor substrate may exhibit an appropriate polishing rate and excellent polishing flatness.

EXPLANATION OF MARKS

10: Polishing pad sheet
12: Second surface
P: Reference plane
101: First layer
102: Second layer
100: Polishing pad
11: First surface
201: Grooves
110: Polishing pad
120: Surface plate
130: Semiconductor substrate
140: Nozzle
20: Polishing layer
30: First adhesive layer
40: Second adhesive layer
13: Polishing surface
150: Polishing slurry
160: Polishing head
170: Conditioner A: Linear distance value from the reference plane to the vertex of the peak with the maximum height
V: Linear distance value from the reference plane to the vertex of the valley with the maximum depth
T: Linear distance value from the vertex of the valley at the maximum depth to the vertex of the peak at the maximum height

What is claimed is:

1. A polishing pad sheet comprising:
   a first surface which is a polishing layer attachment surface; and
   a second surface which is a rear surface of the first surface,
   wherein the first surface has a value of the following Equation 1 of 4.20 to 5.50:

$$\frac{|Sv|}{Sz} \times P(\%) \qquad \text{[Equation 1]}$$

where, Sv is a maximum pit height roughness value of the first surface, Sz is a maximum height roughness value of the first surface, and P is a compressibility (%) value calculated from the equation of $(D1-D2)/D1 \times 100$ by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

2. The polishing pad sheet of claim 1, wherein the first surface has a value of the following Equation 2 of 0.10 to 0.35:

$$\frac{|Sv|}{Sz} \qquad \text{[Equation 2]}$$

In Equation 2 above, Sv is a maximum pit height roughness value of the first surface, and Sz is a maximum height roughness value of the first surface.

3. The polishing pad sheet of claim 1, wherein the first surface has a value of the following Equation 3 of 1.50 to 2.50:

$$\frac{Sa}{Sz} \times P(\%) \qquad \text{[Equation 3]}$$

In Equation 3 above, Sa is an arithmetical mean height roughness value of the first surface, Sz is a maximum height roughness value of the first surface, and P is a compressibility (%) value calculated from the equation of $(D1-D2)/D1 \times 100$ by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

4. The polishing pad sheet of claim 3, wherein the first surface has a value of the following Equation 4 of 0.10 to 0.20:

$$\frac{Sa}{Sz} \quad \text{[Equation 4]}$$

In Equation 4 above, Sa is an arithmetical mean height roughness value of the first surface, and Sz is a maximum height roughness value of the first surface.

5. The polishing pad sheet of claim 1, comprising:
a first layer containing a fibrous nonwoven fabric and a resin impregnated in the fibrous nonwoven fabric; and
a second layer which is a coating layer on at least one surface of the first layer,
wherein a surface opposite to the first layer side of the second layer is the first surface.

6. The polishing pad sheet of claim 5, wherein the thickness ratio of the second layer to the first layer is 1:0.08 to 1:0.25.

7. The polishing pad sheet of claim 5, wherein the fibrous nonwoven fabric is selected from the group consisting of polyester fibers, polyamide fibers, polypropylene fibers, polyethylene fibers, and combinations thereof.

8. The polishing pad sheet of claim 5, wherein the resin is selected from the group consisting of a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof.

9. The polishing pad sheet of claim 5, wherein the coating layer contains a polyurethane resin.

10. The polishing pad sheet of claim 1, wherein the first surface has a surface hardness of 60 to 90 based on Asker C hardness.

11. The polishing pad sheet of claim 1, wherein the polishing pad sheet has a density of 0.300 g/cm³ to 0.800 g/cm³.

12. A polishing pad comprising:
a polishing layer and a cushion layer,
wherein the cushion layer is derived from a polishing pad sheet, the polishing pad sheet includes: a first surface which is a polishing layer attachment surface; and a second surface which is a rear surface of the first surface, the first surface has a value of the following Equation 1 of 4.20 to 5.50, and the adhesive force of the polishing layer attachment surface to the polishing layer is 8.00 kgf/25 mm or more:

$$\frac{|Sv|}{Sz} \times P(\%) \quad \text{[Equation 1]}$$

where, Sv is a maximum pit height roughness value of the first surface, Sz is a maximum height roughness value of the first surface, and P is a compressibility (%) value calculated from the equation of (D1−D2)/D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

13. The polishing pad of claim 12, wherein the polishing layer and the cushion layer have a density difference of 0.30 g/cm³ to 0.50 g/cm³.

14. The polishing pad of claim 12, wherein a compressibility (%) value calculated from the equation of (D1−D2)/D1×100 by collecting a specimen measuring 25 mm in width and length each with respect to the entire laminated structure, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed is 1.0% to 1.5%.

15. The polishing pad of claim 12, wherein the polishing layer has a thickness of 0.8 mm to 5.0 mm.

16. The polishing pad of claim 12, wherein the cushion layer has a thickness of 0.5 mm to 2.5 mm.

17. The polishing pad of claim 12, further comprising:
a first adhesive layer that becomes a medium for the attachment of the polishing layer and the cushion layer.

18. The polishing pad of claim 12, further comprising:
a second adhesive layer disposed on the second surface.

19. A method for manufacturing a semiconductor device, the method comprising the steps of:
providing a polishing pad including a polishing layer and a cushion layer; and
disposing the surface to be polished of a polishing object to be in contact with the polishing surface of the polishing layer and then polishing the polishing object while rotating them relative to each other under a pressurized condition,
wherein the polishing object includes a semiconductor substrate, the cushion layer is derived from a polishing pad sheet, the polishing pad sheet includes: a first surface which is a polishing layer attachment surface; and a second surface which is a rear surface of the first surface, the first surface has a value of the following Equation 1 of 4.20 to 5.50, and the adhesive force of the polishing layer attachment surface to the polishing layer is 8.00 kgf/25 mm or more:

$$\frac{|Sv|}{Sz} \times P(\%) \quad \text{[Equation 1]}$$

where, Sv is a maximum pit height roughness value of the first surface, Sz is a maximum height roughness value of the first surface, and P is a compressibility (%) value calculated from the equation of (D1−D2)/D1×100 by collecting a specimen measuring 25 mm in width and length each from the polishing pad sheet, measuring a dial gauge in no-load condition, and then pressing with a standard weight of 85 g to measure the first thickness (D1) when 30 seconds have elapsed, and by setting up a pressure condition in which 800 g of a weight is added to the standard weight and measuring the second thickness (D2) when 3 minutes have elapsed.

20. The method of claim 19, wherein the surface to be polished of the polishing object has a load pressurized on the polishing surface of the polishing layer of 0.01 psi to 20 psi.

\* \* \* \* \*